United States Patent [19]

Matsuzawa et al.

[11] Patent Number: 4,519,870

[45] Date of Patent: May 28, 1985

[54] METHOD FOR PRODUCING A SINGLE CRYSTAL

[75] Inventors: Soichiro Matsuzawa, Toyoake; Syunzo Mase, Ama, both of Japan

[73] Assignee: NGK Insulators, Ltd., Nagoya, Japan

[21] Appl. No.: 443,030

[22] Filed: Nov. 19, 1982

Related U.S. Application Data

[62] Division of Ser. No. 151,605, May 20, 1980, Pat. No. 4,402,787.

[30] Foreign Application Priority Data

May 31, 1979 [JP] Japan ................................. 54-67893
Aug. 2, 1979 [JP] Japan ................................. 54-98055

[51] Int. Cl.³ ............................................... C30B 1/10
[52] U.S. Cl. ............................. 156/603; 156/DIG. 65
[58] Field of Search ........... 156/603, DIG. 88, 616 R, 156/DIG. 61, DIG. 74, DIG. 105, DIG. 65

[56] References Cited

U.S. PATENT DOCUMENTS

| | | | |
|---|---|---|---|
| 2,992,903 | 7/1961 | Imber | 156/603 |
| 3,160,521 | 12/1964 | Ziegler et al. | 156/603 |
| 3,348,962 | 10/1967 | Grossman et al. | 156/DIG. 88 |
| 3,350,240 | 10/1967 | Higuchi et al. | 156/603 |
| 3,429,831 | 2/1969 | Garfinkel et al. | 156/603 |
| 3,585,088 | 6/1971 | Schwuttke et al. | 156/603 |
| 3,655,439 | 4/1972 | Seiter | 156/603 |
| 3,694,269 | 9/1972 | Bailey et al. | 156/603 |
| 4,046,618 | 9/1977 | Chaudhari et al. | 156/603 |
| 4,057,458 | 11/1977 | Maeda et al. | 156/603 |

OTHER PUBLICATIONS

*Journal of the American Ceramic Society,* vol. 41, No. 8, pp. 300–303, "Grain Growth in Nickel Ferrites".
Budikov et al., "Principles of Solid State Chemistry", 1968, pp. 303–309.

*Primary Examiner*—Hiram H. Bernstein
*Attorney, Agent, or Firm*—Parkhurst & Oliff

[57] ABSTRACT

A single crystal is produced by contacting a polycrystal showing a discontinuous crystal grain growth at a temperature not lower than T° C. to a seed single crystal having substantially the same crystal structure as the polycrystal and heating the contacted crystals at a temperature (t° C.) lower than the temperature T° C. to cause a solid phase reaction at an interface between microcrystal grains composing the polycrystal and the seed single crystal, whereby the microcrystal grains in the polycrystal are integrated to the seed single crystal to grow the single crystal.

17 Claims, 8 Drawing Figures

FIG_6
FIG_7
FIG_8
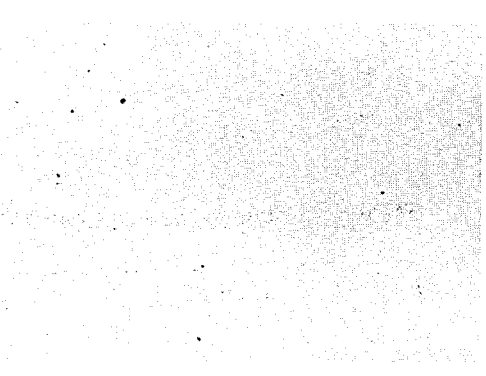

METHOD FOR PRODUCING A SINGLE CRYSTAL

This is a division of application Ser. No. 151,605 filed May 20, 1980 now U.S. Pat. No. 4,402,787.

The present invention relates to a method for producing a single crystal by contacting a polycrystal to a single crystal and firing the contacted crystals to grow the single crystal through a solid phase reaction.

Heretofore, as the method for producing a single crystal, the methods wherein a starting material is melted at a temperature higher than a melting point of the starting material and a single crystal is grown from the molten liquid phase, such as pick up process, Bernoulli process, Bridgman process, floating zone melting process, flux process and the like have been broadly known.

However, any conventional method wherein a single crystal is grown from the molten liquid phase needs a high temperature, so that when a starting material containing a component having a high vapor pressure is used, the composition readily varies and impurities are readily admixed from a crucible used for melting the starting material, so that the crystallinity of the obtained single crystal is not uniform. Furthermore, all the above described conventional methods need a large size of expensive complicated production apparatus and the production condition is severe, so that the mass production is difficult and therefore the obtained single crystal product becomes a high cost.

The present invention has been made for obviating these prior defects and problems and consists in a method for producing a large single crystal wherein a single crystal which is a seed (nucleus) is contacted to a polycrystal and the contacted crystals are fired to effect a solid phase reaction whereby a single crystal is grown and particularly consists in a method for producing a single crystal wherein a polycrystal showing a discontinuous crystal grain growth at a high temperature is contacted with a single crystal, in which the composition is substantially the same as or different from the polycrystal and the crystal structure is substantially the same as the polycrystal and the contacted crystals are heated at a temperature lower then the temperature at which a discontinuous crystal grain growth is caused, to cause a solid phase reaction at the interface between microcrystal grains forming the polycrystal and the single crystal and integrate the microcrystal grains in the polycrystal and the single crystal to grow the single crystal.

Namely, the present invention is based on the discovery obtained from a large number of studies that a particularly defined polycrystal, that is a polycrystal showing a discontinuous crystal grain growth is contacted to a single crystal and the contacted crystals are heated at a particularly defined temperature, that is a temperature lower than the temperature at which the discontinuous crystal grain growth of the polycrystal occurs, to grow the single crystal to a larger single crystal.

The present invention will be explained in more detail. It has been known that the polycrystal wherein microcrystals assemble, includes a polycrystal (for example, alumina, nickel ferrite, barium titanate) showing a discontinuous crystal grain growth as shown in FIG. 1, curve A in which when the firing temperature reaches a particularly defined temperature T, a part of crystal grains suddenly integrates the surrounding microcrystal grains and grows to macrocrystal grain at a far higher grain growing speed than the growing speed of the surrounding microcrystal grains, and a general polycrystal showing a continuous crystal grain growth as shown in FIG. 1, curve B, in which crystal grains grow with raising of temperature.

In the present invention, among these polycrystals, only the polycrystal showing the discontinuous crystal grain growth at the particularly defined temperature T°C. as shown in the curve A can be effectively used. Each contacting surface of the polycrystal showing the discontinuous crystal grain growth as shown in the curve A and the single crystal having substantially the same crystal structure as the polycrystal is polished, for example, on a tin disc by means of diamond abrasive grains preferably to a roughness Rmax of less than 0.2 $\mu$m, more preferably less than 0.1 $\mu$m, both the polished surfaces are contacted directly or in the presence of a solution of an organic or inorganic acid salt containing a metal element composing the polycrystal or single crystal and/or a solution dissolving partially the polycrystal or single crystal and both the contacted crystals are heated at a low temperature to bond both the crystals. When the thus bonded crystals are heated at a temperature which is lower than the temperature causing the discontinuous crystal grain growth of the polycrystal, that is a temperature lower than T°C. in FIG. 1 and near T°C. as far as possible, a solid phase reaction occurs at the interface between the microcrystal grains composing the polycrystal and the single crystal and the single crystal integrates the microcrystal grains in the polycrystal and the single crystal gradually grows to form a larger single crystal. In the present invention, it is possible to convert the total bonded polycrystal into the single crystal but in accordance with the application, it is possible to convert only a part of the polycrystal into the single crystal.

In the present invention, it is most important that the polycrystal showing the discontinuous crystal grain growth as shown in FIG. 1, curve A is used as the polycrystal and the heating is effected at the temperature lower than T°C. in FIG. 1, that is the temperature lower than the temperature at which the discontinuous crystal grain growth occurs.

That is, the polycrystal showing the discontinuous crystal grain growth does not substantially vary the crystal grain size until the heating temperature reaches the particularly defined temperature T°C. as shown in FIG. 1, curve A, even if the temperature is raised and if the heating temperature is within the temperature range to the particularly defined temperature T°C., even though the firing maintaining time becomes long as shown in FIG. 2, curve D, the crystal grain size does not substantially vary. In other words, until the polycrystal showing the discontinuous crystal grain growth reaches the particularly defined temperature T°C., the crystal does not substantially grow and maintain the fine crystal grain size.

On the contrary, the polycrystal showing the continuous crystal grain growth shows the crystal growth with raising of the temperature and lapse of the firing maintaining time as shown in FIG. 1, curve B and FIG. 2, curve C. In order to grow the single crystal through the solid phase reaction of the present invention, it is important that the crystal grain size of the polycrystal to be contacted is fine and therefore, the polycrystal showing the discontinuous crystal grain growth in which the crystal is not substantially grown up to the particularly defined temperature T°C. should be used as mentioned above.

Because in the interface between the single crystal and the microcrystal grains composing the polycrystal, the smaller the diameter of the microcrystal grains, the smaller the curvature radius of the interface is, so that the transfer speed of the grain boundary is larger and the curvature of the interface is always negative value in the single crystal side, so that particularly the single crystal can be grown and therefore, the crystal grains in the polycrystal should be fine as mentioned above and the polycrystal must be ones showing the discontinuous crystal grain growth.

The term "polycrystal showing the discontinuous crystal grain growth" used herein means the polycrystal in which as shown in FIG. 1, curve A, a part of the crystal grains suddenly incorporates the surrounding fine crystal grains when the firing temperature reaches the particularly defined temperature T°C., and the microcrystal grains grow into macrocrystal grains at a very rapid grain growing speed of more than 10 times as high as the growing speed of the surrounding microcrystal grains.

Such a polycrystal has been confirmed by effecting previously the heating test. Such a polycrystal may be optionally produced by selecting the starting material, production condition and the like. The term "temperature lower than the temperature at which the discontinuous crystal grain growth occurs", which is the temperature (t) for heating the bonded crystals means the temperature lower than the temperature at which a part of microcrystal grains suddenly grow into macrocrystal as shown in FIG. 1, T°C. and is preferred to be a temperature within 100° C. lower than T°C. $(T-100 \leq t < T)$ and this temperature has been confirmed by previously carrying out the heating test and is settled to a given temperature.

The heating process may be a usual sintering process or hot press process. As the polycrystal showing the discontinuous crystal grain growth, the polycrystal having a crystal grain size of less than 30μ, preferably not greater than 15μ, and a porosity of less than 0.5% is preferable.

Furthermore, it is preferable that the above described solution exists between the contacting surfaces of the polycrystal and the single crystal and this is effective for improving the activity of the interface between the microcrystal grains and the single crystal and promoting the occurrence of the solid phase reaction.

The effect of the present invention will be explained with reference to the examples.

Single crystals of ferrite, garnet, spinel and the like can be produced by the method of the present invention. The composition of the polycrystals to be used in the present invention is as follows.

| I. Ferrite | MnO | 20-40 mol % |
| | ZnO | 5-30 mol % |
| | $Fe_2O_3$ | balance (preferably 45-55%) |
| II. Ferrite | NiO | 15-40 mol % |
| | ZnO | 15-40 mol % |
| | $Fe_2O_3$ | balance (preferably 45-55%) |

III. Garnet includes $2Y_2O_3.5Fe_2O_3$ and $2Y_2O_3.5Al_2O_3$, which can be produced by the method of the present invention.
  Compounding ratio
   $Y_2O_3:Fe_2O_3 = 2:5$
   $Y_2O_3:Al_2O_3 = 2:5$ IV. Spinel is $MgO.Al_2O_3$ and the compounding ratio of $MgO:Al_2O_3$ is 1:1.

The above exemplified polycrystals of ferrite, garnet and spinel can provide the united single crystals by contacting said polycrystal to the single crystal having substantially the same crystal structure as the polycrystal and firing the contacted crystals at a high temperature. In the case of ferrite among the above described polycrystals and single crystals, even if the composition of the polycrystal and the single crystal is more or less different, the united ferrite single crystal can be obtained. This does not mean that the contact of, for example, manganese zinc ferrite single crystal or polycrystal and nickel zinc ferrite polycrystal or single crystal is possible but means that the single crystal can be produced by the contact of mutual manganese zinc ferrite or mutual nickel zinc ferrite and that if the ferrite is the same kind, the compounding ratio may not be identical.

The single crystal which is a seed crystal to be contacted to the above described polycrystal, may be produced by the conventional known process. However, unless the polycrystals are produced by the particularly defined process, the unique property showing the discontinuous crystal growth at the above described high temperature cannot be obtained. When one embodiment thereof is mentioned, in the case of ferrite polycrystal and garnet polycrystal, iron oxide ($Fe_2O_3$) having a specially high purity (more than 99.9%) should be used. In the production of spinel polycrystal, alumina ($Al_2O_3$) having a specially high purity (more than 99.9%) should be used. This iron oxide is produced by purifying iron sulfate or iron chloride. In this case, iron oxide showing the discontinuous crystal growth at the above described high temperature and iron oxide not showing the above described property are produced depending upon the process for producing iron oxide. Accordingly, in the present invention iron oxide showing the discontinuous crystal growth at the high temperature must be used among iron oxide having a high purity.

Accordingly, if such an iron oxide is used, the present invention can apply to all the generally known composition ranges in manganese zinc ferrite, nickel zinc ferrite or garnet.

The firing temperature for producing manganese zinc ferrite single crystal is a range of about 1,250°-1,450° C. and in manganese zinc ferrite polycrystal to be used for the product, the limiting temperature (T°C.) starting the discontinuous crystal grain growth varies depending upon the purity, composition, average grain size and porosity of the starting material, so that the firing temperature is selected from the above described temperature range depending upon the purity, composition, average grain size and porosity of the starting material.

The firing temperature for producing nickel zinc ferrite single crystal is a range of about 1,250°-1,550° C. and in nickel zinc ferrite polycrystal to be used for the product, the limiting temperature (T°C.) starting the discontinuous crystal grain growth varies depending upon the purity, composition, average grain size and porosity of the starting material, so that the firing temperature is selected from the above described temperature range depending upon the purity, composition and porosity of the starting material.

The firing temperature for producing garnet and spinel single crystals is a range of about 1,300°-1,450° C. and about 1,700°-1,900° C. respectively and in each polycrystal to be used for these products, the limiting temperature showing the discontinuous crystal grain growth varies depending upon the purity, composition, average grain size and porosity of the starting material, so that the firing temperature is selected from the above described temperature range depending upon the purity, composition, average grain size and porosity of the starting material.

At temperatures lower than the lower limits of the above described firing temperatures of ferrite, garnet and spinel, the single crystals cannot be obtained in the practical economic speed. At temperatures higher than the upper limits of the above described firing temperature, the temperatures exceed the above described limiting temperatures which cause the discontinuous crystal grain growth and the desired single crystals cannot be obtained.

For better understanding of the invention, reference is taken to the accompanying drawings, in which:

BRIEF DESCRIPTION OF THE DRAWINGS

FIGS. 6 and 7 are photomicrographs showing the solid phase reaction of the products produced under the conditions beyond the limiting range of the present invention; and FIG. 8 is a photomicrograph of yttrium iron garnet single crystal produced by the production method of the present invention.

The following examples are given for the purpose of illustration of this invention and are not intended as limitations thereof.

EXAMPLE 1

Manganese oxide having a purity of 99.9%, which has been obtained by roasting manganese carbonate, zinc oxide and ferric oxide having a purity of 99.9% were used and a mixture of 31 mol% of MnO, 16.5 mol% of ZnO and 52.5 mol% of $Fe_2O_3$ and containing less than 0.01% of $SiO_2$, less than 0.05% of $TiO_2$, less than 0.005% of CaO and less than 0.03% of $Na_2O$ as impurities was shaped and heated at 1,320° C. for 4 hours under equilibrium oxygen partial pressure to obtain manganese zinc ferrite polycrystal.

This ferrite polycrystal had an average grain size of about 10μ and a porosity of about 0.1% and the temperature starting the discontinuous crystal grain growth was 1,360° C. From this ferrite polycrystal and ferrite single crystal having substantially the same composition as this ferrite polycrystal and produced by high pressure Bridgman process, plates 15×15×5 mm and 15×15×0.5 mm were cut off respectively and each contacting surface of these plates was polished with a tin disc by means of diamond abrasive grains to a roughness Rmax of 0.05μ. 1N of $HNO_3$ solution was applied on the polished contacting surfaces and the polycrystal ferrite plate and the single crystal ferrite plate were superposed and heated at 1,250° C. for 30 minutes under nitrogen atmosphere and then maintained for 15 hours at a temperature of 1,350° C. which is lower than the above described temperature of 1,360° C., at which the discontinuous crystal grain growth of ferrite polycrystal occurs, to cause a solid phase reaction, whereby single crystal (O) of the present invention was obtained.

Figure 1:
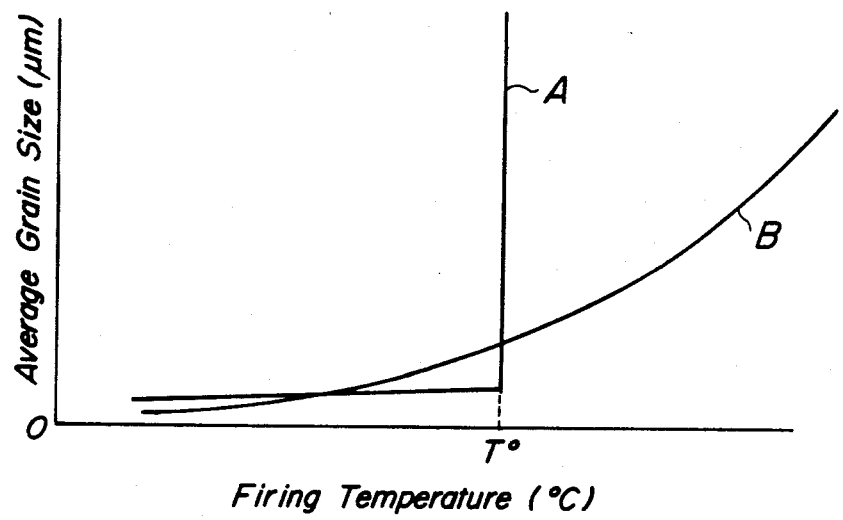
FIG. 1 is a graph showing the relation of the firing temperature to the average grain size of polycrystals.
Figure 2:
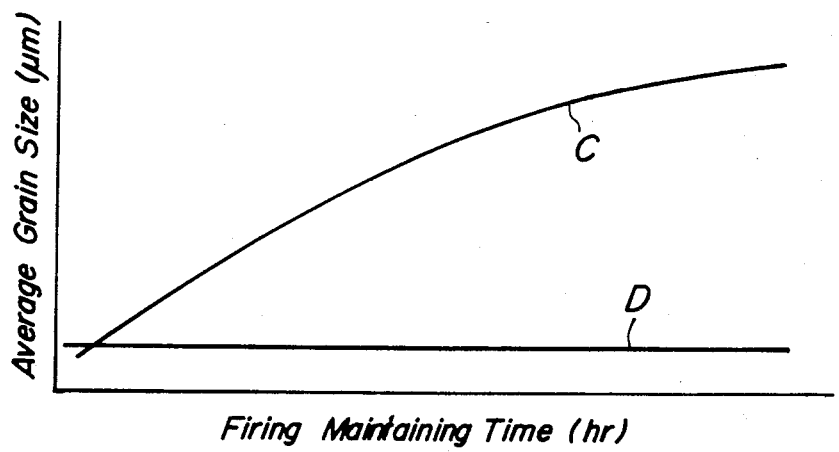
FIG. 2 is a graph showing the relation of the firing maintaining time to the average grain size of polycrystals.

For comparison, the same ferrite polycrystal plate and ferrite single crystal plate as described above were superposed and maintained for 2 hours at a temperature of 1,380° C., which is higher than the temperature which causes the discontinuous crystal grain growth of the ferrite polycrystal and is beyond the limiting range of the present invention, to cause a solid phase reaction to obtain a product (P). A ferrite polycrystal showing the continuous crystal grain growth as shown in FIG. 1, curve B was used and the other conditions were same as described above to obtain a product (Q).

The contacting surfaces of the ferrite polycrystal and the ferrite single crystal of the above described three samples (O), (P) and (Q) were observed by microscope and the results are shown by photomicrographs in FIGS. 3-7. As seen from the photomicrographs, in the product (O) (FIG. 4) produced by the production method of the present invention, wherein the polycrystal showing the discontinuous crystal grain growth is used and the heating is effected at a temperature lower than the temperature at which the discontinuous crystal grain growth is caused, the single crystal grows about 1.5 mm toward the polycrystal from the contacting surface (FIG. 3) (the arrow mark shows the contacting surface) prior to the heating and a large ferrite single crystal was obtained.

Figure 3:
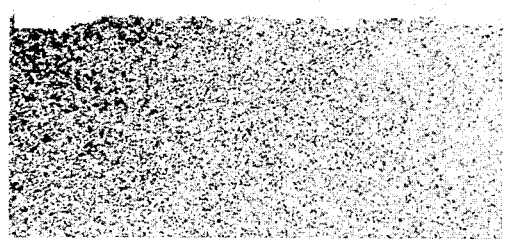
FIG. 3 is a photomicrograph showing the contacting surface of the ferrite singly crystal and the ferrite polycrystal, according to the present invention.
Figure 4:
FIG. 4 is a photomicrograph of the ferrite single crystal produced by the production method of the present invention.
Figure 5:
FIG. 5 is a photomicrograph showing the contacting surface of the ferrite single crystal and the ferrite polycrystal not included in the present invention.

FIG. 5 shows a mere contacting surface of the polycrystal showing the continuous crystal grain growth and the single crystal and in the product (Q) obtained by firing the bonded crystals in which the polycrystal is beyond the limiting range of the present invention, at 1,350° C. for 15 hours, the polycrystal itself grows greatly the grains as shown in FIG. 6 and the growth of the single crystal is prevented and large ferrite single crystal cannot be obtained. The product (P) obtained by firing the bonded crystals having the contacting surface as shown in FIG. 3 at 1,380° C. which is higher than the above described limiting temperature (1,360° C.) for 2 hours, is shown in FIG. 7 and as seen from FIG. 7, the polycrystal itself grows the grain and the growth of the single crystal is prevented and no large ferrite single crystal is obtained.

EXAMPLE 2

A mixture having a chemical composition of 31 mol% of MnO, 16.5 mol% of ZnO and 52.5 mol% of $Fe_2O_3$ was shaped and fired at 1,320° C. for 4 hours under equilibrium oxygen partial pressure to obtain manganese zinc ferrite polycrystal. This ferrite polycrystal had an average grain size of about 10 μm and a porosity of about 0.1% and the temperature starting the discontinuous crystal grain growth was 1,360° C. From this ferrite polycrystal, a plate 15×15×3 mm was cut off and from ferrite single crystal having a chemical composition of 30 mol% of MnO, 18 mol% of ZnO and 52 mol% of $Fe_2O_3$ and produced by high pressure Bridgman process, a thin plate 15×15×0.3 mm was cut off, so that the contacting surface of the single crystal becomes plane (100). Each contacting surface of the polycrystal plate and the single crystal plate was polished by means of diamond abrasive grains to a roughness Rmax of 0.05 μm to produce a seed single crystal ferrite plate having a thickness of 0.25 mm and a polycrystal ferrite plate having a thickness of 2.8 mm and to the polished contacting surfaces was applied 1N of aqueous solution of $H_2SO_4$ and the polycrystal ferrite plate and the single crystal ferrite plate were superposed and put in a setter made of ferrite and heated at 1,250° C. for 30 minutes under nitrogen atmosphere lower than equilibrium oxygen partial pressure and then the bonded crystal plates were kept for 2 hours at 1,340° C. which is lower than the above described temperature of 1,360° C. which causes the discontinuous crystal grain growth of the polycrystal ferrite to cause a solid phase reaction, whereby a ferrite body to be used as a magnetic head according to the present invention was obtained. The cross-section including the single crystal portion and the polycrystal portion of the obtained ferrite was observed by microscope and it has been found that the originally superposed seed single crystal ferrite grows and the polycrystal portion of an average of 0.25 mm from the contacting surface of the originally contacted polycrystal ferrite was converted into single crystal. Then, the single crystal portion including the originally superposed seed single crystal ferrite portion was polished and removed 0.3 mm to produce a ferrite block remaining the single crystal portion where has been formed by conversion of a part of the polycrystal ferrite into single crystal. From this ferrite block, a magnetic head for VTR image was manufactured as follows. This ferrite block was cut and worked so that the single crystal ferrite portion in this ferrite block positions at a sliding surface of a magnetic tape in the magnetic head, to produce a ferrite bar 1.8×2.7×15 mm and then the magnetic gap forming surface of this bar was polished into mirror surface and then grooves to define track width of the magnetic head and grooves for receiving coil winding were formed. The mirror surfaces of these two bars were opposed and these two bars were bonded and filled with glass by glass bonding to form magnetic gaps having a width of 0.5μ to produce a core block. This core block was further cut and worked into core chips and a core chip was wound with coil to produce a magnetic head for VTR image. Then, from a ferrite block in which the seed single crystal ferrite portion was completely removed, a ring core having a thickness of 1.5 mm consisting of the single crystal portion having a thickness of about 0.2 mm and the polycrystal ferrite portion having a thickness of about 1.3 mm, an inner diameter of 6 mm and an outer diameter of 10 mm was cut off and the initial permeability at 1 KHz was measured. For comparison, from a ferrite block remaining 0.2 mm of the seed single crystal ferrite portion, a single crystal ferrite block used for manufacturing the magnetic head according to the present invention and a polycrystal ferrite block, ring cores having the same shape as the above described dimension were cut off and the initial permeability was measured. The obtained results are shown in Table 1. It has been confirmed from Table 1 that the initial permeability of the ferrite for the magnetic head produced by the production method of the present invention is substantially same as that of the polycrystal ferrite and the initial permeability is not reduced by conversion of a part of polycrystal ferrite into single crystal. The initial permeability of the ferrite remaining a part of the seed single crystal is extremely low and a strain remains in the obtained ferrite due to the difference of the thermal expansion coefficient based on the difference of the chemical composition of the seed single crystal ferrite and the polycrystal ferrite.

In the production method of the present invention in which a magnetic head is manufactured from the ferrite block wherein the seed single crystal ferrite portion is removed, cracks, chippings and the like were not substantially formed during working.

TABLE 1

|  | Single crystal ferrite | Polycrystal ferrite | Ferrite according to the present invention | Ferrite remaining seed single crystal ferrite |
|---|---|---|---|---|
| Initial permeability (1 KHz, 5 mOe) | 8,000 | 11,000 | 10,200 | 4,000 |

The output, sliding noise (S/N ratio) and durable life of the magnetic head for VTR image manufactured according to the present invention were measured. For comparison, a magnetic head using the single crystal ferrite and a magnetic head using the polycrystal ferrite were manufactured respectively and the similar measurement was made. The obtained results are shown in Table 2 and it has been found from Table 2 that the magnetic head according to the present invention shows the same high S/N ratio as in the polycrystal ferrite head and the same long durable life as in the single crystal ferrite head and has both the characteristics of the polycrystal ferrite magnetic head in view of the sliding noise and of the single crystal ferrite magnetic head in view of the durable life.

TABLE 2

|  | Output (5 MHz) (μV) | S/N (dB) | Durable life (hr) |
|---|---|---|---|
| Magnetic head of this invention | 270 | 42 | 1,000 |
| Single crystal magnetic head | 260 | 35 | 1,100 |
| Polycrystal magnetic head | 250 | 43 | 450 |

EXAMPLE 3

A mixture having a chemical composition of 28 mol% of MnO, 19.5 mol% of ZnO and 52.5 mol% of $Fe_2O_3$ was shaped and fired at 1,310° C. for 4 hours under equilibrium oxygen partial pressure to obtain manganese zinc ferrite polycrystal. This polycrystal had an average grain size of about 8 μm and a porosity of about 0.05% and the temperature starting the discontinuous crystal grain growth was 1,360° C. From this polycrystal ferrite, a plate 15×15×3 mm was cut off. From single crystal ferrite having a chemical composition of 30 mol% of MnO, 18 mol% of ZnO and 52 mol% of $Fe_2O_3$ and produced by high pressure Bridgman process, a thin plate 15×15×0.3 mm was cut off so that the contacting surface of the single crystal becomes plane (100). Each contacting surface of both the plates were polished by means of diamond abrasive grains into a roughness Rmax of 0.2 mm to produce a seed single crystal plate having a thickness of 0.25 mm and a polycrystal plate having a thickness of 2.8 mm and both the ferrite plates were superposed and a pressure of 50 kg/cm² was applied between the contacting surfaces and fired for 4 hours under equilibrium oxygen partial pressure at 1,330° C. which is lower than a temperature of 1,360° C. at which the discontinuous crystal grain growth of the polycrystal ferrite occurs, to obtain the ferrite body to be used for the magnetic head of the present invention. The cross-section including the single crystal portion and the polycrystal portion of the obtained ferrite body was observed by microscope and it has been found that the originally superposed single crystal grew and the polycrystal portion of 0.3 mm in average from the contacting surface of the originally contacted polycrystal ferrite was converted into single crystal. Then, the single crystal portion including the originally superposed seed single crystal ferrite portion was polished and removed 0.3 mm to produce a ferrite block remaining single crystal portion formed by conversion of a part of polycrystal ferrite. From this ferrite block, a magnetic head for VTR image was manufactured as follows. This ferrite block was cut and worked, so that the newly formed single crystal ferrite portion in this ferrite block positions at a sliding surface of a magnetic tape in the magnetic head, to produce a ferrite bar 1.8×2.7×15 mm and then the magnetic gap forming surface of this bar is polished into mirror surface and then grooves to define track width of the magnetic head and grooves for receiving coil winding were formed. The mirror surfaces of these two bars were opposed and these two bars were bonded and filled with glass by glass bonding to form magnetic gaps having a width of 0.5μ to produce a core block. This core block was further cut and worked into core chips and a core chip was wound with coil to produce a magnetic head for VTR image. Then, from a ferrite block in which the seed single crystal ferrite portion was completely removed, a ring core having a thickness of 1.5 mm consisting of the single crystal portion having a thickness of about 0.2 mm and the polycrystal ferrite portion having a thickness of about 1.3 mm, an inner diameter of 6 mm and an outer diameter of 10 mm was cut off and the initial permeability at 1 KHz was measured. For comparison, from a ferrite block remaining 0.15 mm of the seed single crystal ferrite portion, a single crystal ferrite block used for manufacturing the magnetic head according to the present invention and a polycrystal ferrite block, ring cores having the same shape as the above described dimension were cut off and the initial permeability was measured. The obtained results are shown in Table 3. It has been found from Table 3 that the initial permeability of the ferrite for the magnetic head produced by the production method of the present invention is substantially same as that of the polycrystal ferrite and the initial permeability is not reduced by conversion of a part of polycrystal ferrite into single crystal. The initial permeability of the ferrite remaining a part of the seed single crystal ferrite is extremely low and a strain remains in the obtained ferrite due to the difference of the thermal expansion coefficient based on the difference of the chemical composition of the seed single crystal ferrite and the polycrystal ferrite.

In the production method of the present invention in which a magnetic head is manufactured from the ferrite block wherein the seed single crystal ferrite portion is removed, cracks, chippings and the like were not substantially formed during working.

TABLE 3

|  | Single crystal ferrite | Polycrystal ferrite | Ferrite according to the present invention | Ferrite remaining seed single crystal ferrite |
| --- | --- | --- | --- | --- |
| Initial permeability (1 KHz, 5 mOe) | 8,000 | 12,000 | 11,500 | 2,500 |

The output, sliding noise (S/N ratio) and durable life of the magnetic head for VTR image manufactured according to the present invention were measured. For comparison, a magnetic head using the single crystal ferrite and a magnetic head using the polycrystal ferrite were manufactured respectively and the similar measurement was made. The obtained results are shown in Table 4 and it has been found from Table 4 that the magnetic head according to the present invention shows the same high S/N ratio as in the polycrystal ferrite head and the same long durable life as in the single crystal ferrite head and has both the characteristics of the polycrystal ferrite magnetic head in view of the sliding noise and of the single crystal ferrite magnetic head in view of the durable life.

TABLE 4

|  | Output (5 MHz) (μV) | S/N (dB) | Durable life (hr) |
| --- | --- | --- | --- |
| Magnetic head of this invention | 270 | 42 | more than 1,000 |
| Single crystal magnetic head | 260 | 35 | more than 1,000 |
| Polycrystal magnetic head | 250 | 43 | 350 |

As mentioned above, according to the present invention a magnetic head having both the excellent properties of low sliding noise of a magnetic head using a polycrystal ferrite and high abrasion resistance and long durable life of a magnetic head using a single crystal ferrite can be produced easily and cheaply by a simple apparatus and method without using complicated and expensive apparatus and is very excellent as the magnetic head for VTR and is very commercially useful.

EXAMPLE 4

A mixture of 37.5 mol% of $Y_2O_3$ having a purity of 99.99% and 62.5 mol% of $Fe_2O_3$ having a purity of 99.9% and containing less than 0.01% of $SiO_2$, less than 0.005% of CaO and less than 0.003% of $Na_2O$ as impurities was shaped and fired at 1,370° C. for 6 hours to obtain yttrium iron garnet polycrystal.

This polycrystal had an average grain size of about 15μ and a porosity of 0.05% and the temperature starting the discontinuous crystal grain growth was 1,420° C. From this yttrium iron garnet polycrystal and yttrium iron garnet single crystal having substantially the same composition as this polycrystal and produced by flux process, plates 10×10×5 mm and 10×10×0.3 mm were cut off respectively and each contacting surface of these plates was polished with a tin disc by means of diamond abrasive grains to a roughness Rmax of 0.03μ. An aqueous solution of yttrium nitrate and iron nitrate was applied on the contacting surfaces and the polycrystal plate and the single crystal plate were superposed and heated at 1,300° C. for 1 hour and then maintained for 12 hours at a temperature of 1,400° C. which is lower than the temperature causing the discontinuous crystal grain growth, to cause a solid phase reaction, whereby large single crystal of the present invention was obtained. The obtained yttrium iron garnet single crystal was observed by microscope and it has been confirmed that as shown in FIG. 8, all the polycrystal portion is converted into single crystal and the entire body is formed of single crystal.

EXAMPLE 5

A mixture of 50 mol% of MgO having a purity of 99.99% and 50 mol% of $Al_2O_3$ having a purity of 99.9% and containing less than 0.005% of $SiO_2$, less than 0.005% of $TiO_2$ and less than 0.03% of CaO as impurities and added with 0.2% by weight of lithium fluoride was shaped into a plate and the formed plate was fired at 1,700° C. for 5 hours under hydrogen atmosphere to obtain spinel polycrystal. This spinel polycrystal had an average grain size of about 7μ and a porosity of 0.2% and the temperature starting the discontinuous crystal grain growth was 1,800° C.

From this spinel polycrystal and a spinel single crystal produced by Bernoulli process, discs 10 mm in diameter ×5 mm thick and 10 mm in diameter ×0.5 mm thick were cut off respectively and the contacting surfaces of both the discs were polished with a tin disc by means of diamond abrasive grains to a roughness Rmax of 0.05 μm and to the contacting surfaces was applied an aqueous solution of magnesium nitrate and aluminum nitrate and the single crystal and the polycrystal were superposed and heated at a temperature of 1,650° C. for 1 hour to bond both the crystals and the bonded crystals were heated at a temperature of 1,750° C. which is lower than the temperature causing the discontinuous crystal grain growth to grow the spinel single crystal to obtain single crystal according to the present invention.

The contacting surface of the obtained product was observed by a microscope and it has been found that about 3 mm among the polycrystal having a thickness of 5 mm is converted into single crystal by the growth of the single crystal to form a completely integral single crystal and any boundary between the original single crystal and the grown single crystal was not found and both the crystals was completely integrated.

As mentioned above, the method for producing a single crystal according to the present invention comprises contacting a polycrystal showing the discontinuous crystal grain growth to a single crystal having substantially the same crystal structure as the polycrystal and heating the contacted crystals at a temperature lower then the temperature causing the discontinuous crystal grain growth to cause a solid phase reaction to grow the single crystal. The production of the present invention can be effected at a lower temperature than the method for producing single crystal from the conventional liquid phase, so that the unbalance of the composition due to the problem of evaporation component does not occur and an apparatus for producing single crystal which is a large size, complicated and expensive, is not necessary and the single crystal can be produced by the conventional sintering process or hot press process and can be produced commercially inexpensively. The present invention can be applied to production of ceramics and metal single crystal and as an application of the present invention, when a polycrystal in which a part of the polycrystal is converted into single crystal to a given depth, is used as a magnetic core of a magnetic head for VTR image, a magnetic head having a very excellent property, which has never been seen in the conventional magnetic head can be obtained. Furthermore, the present invention can be applied to various magnetic heads, such as magnetic head for digital signal and is very commercially useful.

What is claimed is:

1. In a method for producing a single crystal which comprises contacting a seed single crystal to a fine grain polycrystal body having substantially the same crystal structure as the seed single crystal, and heating the contacted crystals to grow the single crystal towards the polycrystal, the improvement comprising the steps of: (a) using a polycrystal having the property which causes a discontinuous crystal grain growth in the course of heating, (b) heating the contacted crystals to grow the single crystal at a temperature (t°C.) which is lower than the temperature (T°C.) at which the discontinuous crystal grain growth is caused in the polycrystal, and (c) integrating a thickness of at least 0.25 mm of the polycrystal to the seed single crystal to grow the single crystal.

2. The method according to claim 1 characterized in that the entire mass of seed single crystal and polycrystal is heated in bulk.

3. A method for producing a single crystal according to claim 1, wherein a thickness of 0.25 to 5 mm of the polycrystal is integrated to the seed single crystal to grow the single crystal.

4. A method for producing a single crystal according to claim 1 wherein a thickness of 3 to 5 mm of the polycrystal is integrated to the seed single crystal to grow the single crystal.

5. A method as claimed in claim 2, wherein the seed single crystal is one crystal selected from the group consisting of cubic system of ferrite, garnet and spinel.

6. A method as claimed in claim 5, wherein the seed single crystal is ferrite.

7. A method as claimed in claim 6, wherein the seed single crystal ferrite is contacted to the polycrystal ferrite in the given crystallographic orientation and the heating is effected at a temperature being 1,200° C.$\leqq$t$\leqq$1,450° C., whereby the seed single crystal ferrite is grown toward the polycrystal ferrite to convert a part of the polycrystal ferrite into the single crystal in substantially the same crystallographic orientation as the seed single crystal ferrite, after which the original seed single crystal ferrite portion is removed.

8. A method as claimed in claim 2, wherein the heating temperature (t°C.) is as follows:

$T-100\leqq t<T$.

9. A method as claimed in claim 4, wherein the heating temperature (t°C.) is as follows:

$T-100\leqq t\leqq T$.

10. A method as claimed in claim 6, wherein the heating temperature (t°C.) is as follows:

$T-100\leqq t<T$.

11. A method as claimed in claim 5, wherein the heating temperature (t°C.) is as follows:

$T-100\leqq t<T$.

12. A method as claimed in claim 7, wherein the heating temperature (t°C.) is as follows:

$T-100\leqq t<T$.

13. A method as claimed in claim 1, wherein when a given thickness portion of the polycrystal contacting to the seed single crystal is converted into single crystal, the heating is stopped.

14. A method as claimed in claim 1, wherein the seed single crystal is one crystal selected from the group consisting of cubic system of ferrite, garnet and spinel.

15. A method as claimed in claim 14, wherein the seed single crystal is ferrite.

16. A method as claimed in claim 15, wherein the seed single crystal ferrite is contacted to the polycrystal ferrite in the given crystallographic orientation and the heating is effected at a temperature t°C. being 1,200° C.$\leq t \leq$1,450° C., whereby the seed single crystal ferrite is grown toward the polycrystal ferrite to convert a part of the polycrystal ferrite into the single crystal in substantially the same crystallographic orientation as the seed single crystal ferrite, after which the original seed single crystal ferrite portion is removed.

17. A method as claimed in claim 1 wherein the heating temperature (t°C.) is as follows:

$$T - 100 \leq t < T.$$

* * * * *